United States Patent [19]
Giffard

[11] Patent Number: 5,439,836
[45] Date of Patent: Aug. 8, 1995

[54] METHOD FOR PRODUCING A SILICON TECHNOLOGY TRANSISTOR ON A NONCONDUCTOR

[75] Inventor: Benoît Giffard, Grenoble, France

[73] Assignee: Commissariat a l'Energie Atomique, Paris, France

[21] Appl. No.: 274,452

[22] Filed: Jul. 13, 1994

[30] Foreign Application Priority Data

Jul. 22, 1993 [FR] France .................. 93 09021

[51] Int. Cl.6 .......................................... H01L 21/86
[52] U.S. Cl. ........................................ 437/40; 437/21;
  437/913; 148/DIG. 150
[58] Field of Search .............. 437/40, 913, 21, 203,
  437/44; 148/DIG. 150

[56] References Cited

U.S. PATENT DOCUMENTS

| | | |
|---|---|---|
| 5,116,771 | 5/1992 | Karulkar . |
| 5,162,254 | 11/1992 | Usui et al. ............. 437/21 |
| 5,294,555 | 3/1994 | Mano et al. ............ 437/21 |

FOREIGN PATENT DOCUMENTS

| | | | |
|---|---|---|---|
| 0377084 | 11/1990 | European Pat. Off. . | |
| 0442296 | 8/1991 | European Pat. Off. ....... | 437/21 |
| 59-99772 | 6/1984 | Japan .................. | 437/40 |
| 59-099772 | 8/1984 | Japan . | |
| 61-048976 | 10/1986 | Japan . | |
| 0290569 | 3/1990 | Japan ................. | 437/40 |
| 4113677 | 4/1992 | Japan . | |
| 4316333 | 11/1992 | Japan ................. | 437/913 |
| 5090589 | 9/1993 | Japan . | |

OTHER PUBLICATIONS

Akasaka et al., "Self-Aligned Silicide Technology for Ultra-Thin SIMOX MOSFET's, IEEE Transactions in Electron Devices, " vol. 39, No. 5 (May 1992).
Hisamoto et al., "Ultra-Thin SOI CMOS with Selective CVD Tungsten for Low Resistance Source and Drain, " IEEE Transactions on Electron Devices (Arp. 1992).
Omura et al., "0.1-μm-Gate, Ultrathin-Film CMOS Devices Using SIMOX Substrate with 80-nm-Thick Buried Oxide Layer," IEEE Transactions on Electron Devices (Sep. 1991).

Primary Examiner—Brian E. Hearn
Assistant Examiner—Michael Trinh
Attorney, Agent, or Firm—Burns, Doane, Swecker & Mathis

[57] ABSTRACT

Method for producing a silicon technology transistor on a nonconductor. This method consists in particular of forming a thin film of silicon (6) on a nonconductor (4) and then a mask (8, 10) including one opening (13) at the location provided for the channel (26) of the transistor; of locally oxidizing (14) the unmasked silicon to form an oxidation film; of eliminating the mask; of forming source (18) and drain (20) regions in the silicon by ion implantation with the oxidation film being used to mask this implantation; of eliminating the oxidation film; and of forming a thin gate nonconductor between the source and the drain and then forming the gate.

7 Claims, 2 Drawing Sheets

METHOD FOR PRODUCING A SILICON TECHNOLOGY TRANSISTOR ON A NONCONDUCTOR

FIELD OF THE INVENTION

The present invention concerns a method for producing an MIS transistor on a film of silicon formed on a nonconductor.

BACKGROUND OF THE INVENTION

The invention is more particularly applicable for producing MIS or CMOS integrated circuits exhibiting high operating speeds.

The known silicon technology on a nonconductor known under the abbreviation SOI, compared with standard techniques for forming circuits on a massive silicon monocrystalline substrate, is able to reduce parasitic capacities between the active zones and the substrate and thus increase the speed of functioning, increase the integration density and has better resistance to high voltages and low sensitivity to radiations.

There are various techniques for forming a thin film of silicon on a nonconductor. One of these techniques involves the laser recrystallization of an amorphous or polycrystalline silicon film laid on a nonconducting support. This support may be sapphire (technology known under the abbreviation SOS) or a film of silicon oxide obtained via thermal oxidation of a monocrystaline silicon substrate.

A second technique known under the abbreviation BESOI (Bonded and Etched SOI) consists of bonding two substrates with silicon with at least one of them having on the bonding surface a film of SiO2 obtained by thermal oxidation and of then thinning one of the two substrates until the desired thickness is obtained.

A third known technique is based on the ion implantation of a high dose of oxygen or nitrogen in the massive monocrystalline silicon which, once the substrate has been annealed at a high temperature, results in the formation of a nonconducting buried film of silicon oxide or nitride supporting the thin film of monocrystalline silicon. The technology using the implantation of oxygen ions is known under the SIMOX terminology.

The invention is in particular applicable to these various SOI techniques.

The future of SOI lines of products passes through the reduction of the thickness of the silicon film down to about 30 nm in the channel of the transistor, whereas traditionally it is initially 200 nm on the substrates. The problem of using specially thinned substrates so as to finally obtain the desired thickness means that the entire film is thinned, which is suitable for the active portion of the transistor (channel) but results in significant problems for the current gaining access in the drain and source zones of the transistor, in particular due to the fact that the access resistance becomes too considerable in such a thin film.

This problem of parasitic access resistance is described in detail in the document (1) by Y. Omura and al., IEDM 91, CH 3075, p. 675–678, "0.1 μm gate, ultra-thin-film CMOS devices using SIMOX substrate with 80 nm thick buried oxide layer" or again in the document (2) by D. Hisamoto and al., IEEE 1992 (4) 7 803–0817, p. 829–832, "Ultra-thin SOI CMOS with selective CVD tungsten for low resistance source and drain".

One of the solutions put forward is to compensate for the reduction of the thickness of the silicon on the source and drain zones by means of a local epitaxial growth of silicon outside the active zone of the transistor and consequently in the source and drain regions. Unfortunately, this stage is extremely difficult to implement and has not been industrialized.

Another solution consists of using an extremely thin film of silicon (<100 nm) to be silicided on a small thickness in the source and drain zones, as described in the document (3) IEEE transactions on Electron Devices, vol. 39, No 5, May 1992 by Y. Yamagushi and al., "Self-aligned silicide technology for ultra-thin SIMOX MOSFET's", p. 1179–1183. Unfortunately, this siliciding on an extremely small thickness poses significant technological problems.

SUMMARY OF THE INVENTION

The present invention concerns a new method for producing a silicon technology transistor in thin layers on a nonconductor able to resolve these various drawbacks.

To this effect, the invention proposes using sufficiently thick films of silicon and only thin the silicon in the channel of the transistor by means of a localized oxidation. This technique is able to resolve the problem of source and drain contacts which are then formed on the sufficiently thick silicon.

More specifically, the invention concerns a method to produce an MIS transistor comprising a channel, a source and a drain on both sides of the channel and a gate on the channel and separated from the source and the drain, said method comprising the following stages:

a) forming a thin film of silicon on a nonconductor,
b) forming on the thin silicon film a mask including an opening at the location provided for the channel of the transistor,
c) forming a local thick oxidation film by oxidizing the unmasked silicon so as to locally thin the silicon and to form a thinned silicon zone,
d) removing the mask,
e) effecting ion drain and source implantation in the silicon, the oxidation film being used as a self-aligning mask to mask this implantation,
f) removing the oxidation film,
g) forming a thin gate nonconductor between the source and the drain, and
h) forming the gate on the gate nonconductor.

In addition to the advantages mentioned above, the method of the invention allows, by virtue of the local oxidation of the silicon, a self-alignment of the structure with a channel still being embodied in the thinned zone of the silicon. The use of the thick oxide as a mask in fact allows for the self-alignment of the source and the drain with respect to the thinned zone of the channel. In addition, the gate may be formed opening onto the thinned zone; this makes it possible to inexpensively embody a structure with a favourable opening gate so as to limit the degradation or premature aging of the transistors.

As indicated earlier, the thin film of silicon may be embodied according to one of the known SOI techniques. The thin film is preferably formed by a high dose of a oxygen ion followed by an annealing of the implanted substrate.

In addition, the initial substrate may possibly be doped by ions with conductivity opposite that of the source and drain.

In certain applications, it is necessary to employ ion implantation, at least in the channel, so as to adjust the threshold voltage.

In this case, the method of the invention advantageously comprises between the stages f) and g) the following stages:
  oxidizing the silicon film to form a sacrificial oxidation film;
  implanting ions of a type with a conductivity opposite or identical to the source and drain through the sacrificial oxidation film; and
  eliminating the sacrificial oxidation film after implantation.

The gate nonconductor may be an oxide, a nitride or a silicon oxynitride.

Moroever, the gate may be made of metal (W, Al, TiW, TIN), a silicide of a refractory metal ($WSi_2$, $TiSi_2$) or of doped polycrystalline silicon.

DETAILED DESCRIPTION OF THE PREFERRED EMBODIMENTS

Figure 1:
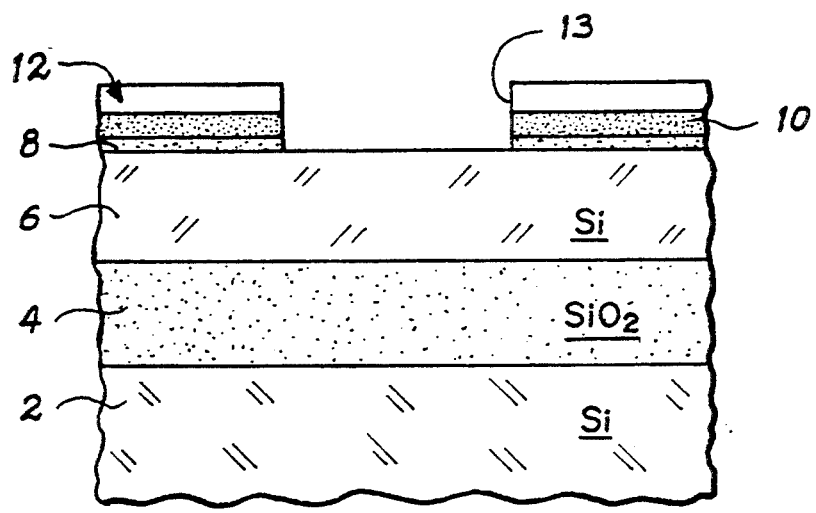
FIGS. 1–6 are cross-sectional views of the processing steps for forming the MIS transistor according to the invention.

As shown on FIG. 1, the first stage consists of forming on a monocrystalline silicon substrate 2 a buried film of silicon oxide 4 supporting a thin film of monocrystalline silicon 6 by using the SIMOX technique. In particular, this silicon structure on a nonconductor is obtained by implanting oxygen ions at a dose of $10^{16}$ to several $10^{18}$ ions/cm2 and then by annealing the implanted structure at a temperature ranging from between 1150° C. and 1400° C.

The implantation and annealing may be repeated several times and the implantation energy is selected as being between 100 and 1000 keV.

By way of example, the thickness of the film 6 of Si is normally between 100 nm and 300 nm and typically 200 nm and the film 4 of $SiO_2$ is 400 nm.

Next, a localized oxidation mask is formed. To this effect, successively formed on the silicon 6 is the growth of a film 8 of oxide, known as a base oxide which protects the Si film, with a thickness of between 5 and 30 nm and typically 13 nm, followed by depositing a film 10 of silicon nitride of between 30 and 200 nm and typically 80 nm. The oxide 8 is obtained via the thermal oxidation of the film 6 and the film 10 via chemical vapor phase depositing.

Then a resin mask 12 is formed according to conventional photolithoetching methods and comprising an opening 13 at the location provided for the channel of the MIS transistor. This opening 13 needs to be as small as possible owing to the fact of the subsequent covering of the source and drain by the gate and so as to obtain an integration density as high as possible.

This is followed by an anisotropic etching of the film 10, for example of the reactive ionic type by using $SF_6$. The film 8 may be etched (partially or totally), for example, by a reactive ionic etching of $CHF_3$.

Then the masking resin 12 is eliminated by using an oxygen plasma.

Figure 2:
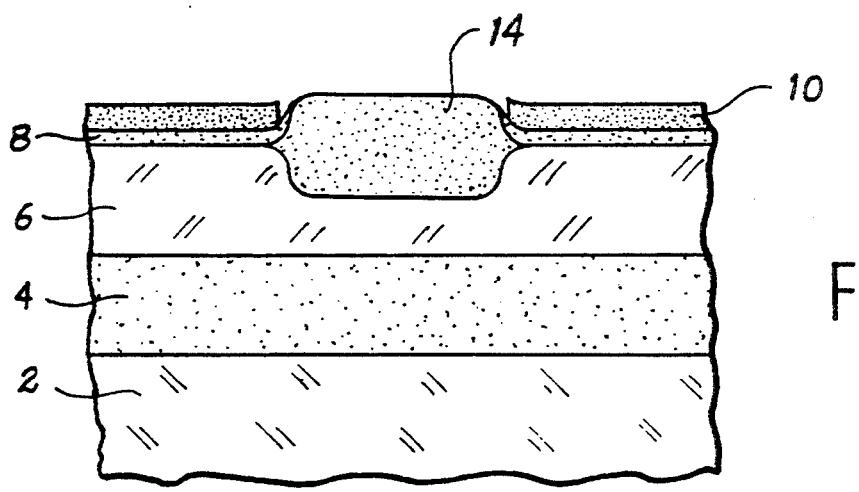

As shown on FIG. 2, this is followed by a localized oxidation of the film 6 of silicon resulting in the formation of a "LOCOS" 14 of between 100 and 500 nm and typically 250 nm. It is formed in the presence of oxygen at a temperature of about 950° C., the etched nitride 10 being used to mask this localized oxidation.

Figure 3:
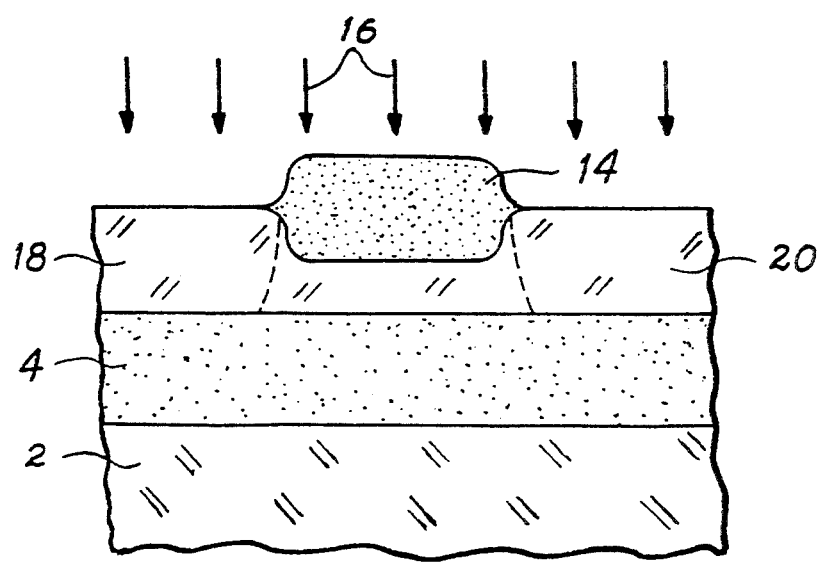

Then the nitride and oxide films are eliminated. The structure obtained is the one shown on FIG. 3.

This is followed by implantation 16 of ions in the silicon film 6 resulting in the formation of the source 18 and drain 20 of the transistor, the LOCOS 14 being used to mask this implantation. This implantation may be of the type N or P according to the nature of the transistor it is sought to form.

For an N channel transistor, an arsenic or phosphorus implantation is used with a dose of between $10^{14}$ and $10^{16}$ at/cm2 and an energy of between 20 and 200 keV.

For a P channel transistor, a boron implantation is used with a dose comparable to that used for the N implantation and with an energy of between 10 and 150 keV.

Then the LOCOS 14 is eliminated by chemical etching by using a mixture of $FH/FNH_4$.

Figure 4:
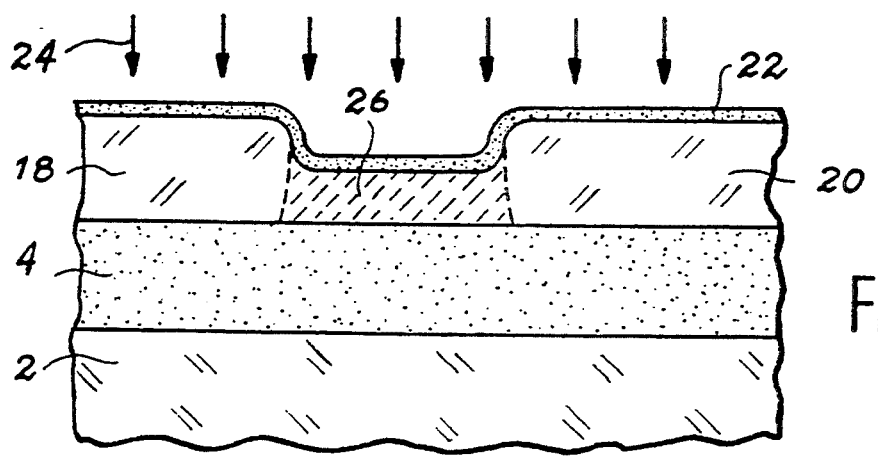

The structure obtained is the one shown on FIG. 4.

Then a sacrificial thin film 22 of oxide of between 20 and 60 nm and for example 45 nm is formed by thermal oxidation of the structure in accordance with the conditions mentioned above. Ion implantation 24 through this film 22 adjusts the threshold voltage on the channel 26. This implantation 24 is effected on the entire structure.

The ions implanted have a conductivity, either of the same type or opposite the one used for the implantation 16, depending on whether it is desired to respectively form a depletion transistor or an enhancement transistor. The implantation dose is mainly weaker than that used for the implantation 16. It is selected as being between $10^{11}$ and $10^{13}$ at/cm2 and the implantation energy ranges between 10 and 100 keV.

Then the film 22 of sacrificial oxide is eliminated by means of chemical attack by using a mixture of $FH/FNH_4$. The use of this sacrificial oxide protects the surface of the transistor and oxidizes possible residues of the nitride film.

Figure 5:
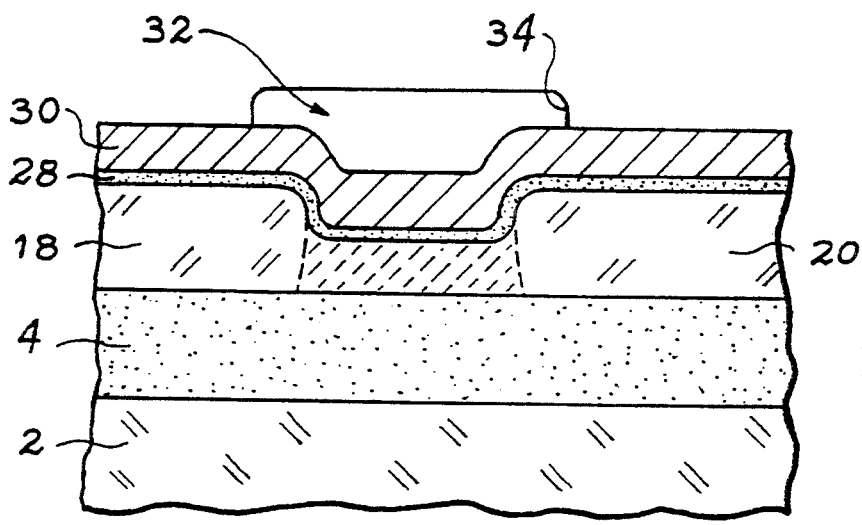

Then, as shown on FIG. 5, the gate oxide 28 is formed with a thickness of between 5 and 20 nm and typically 12 nm on the entire structure by thermal oxidation of the latter in the above-mentioned conditions. Then by chemical vapor phase depositing, a conductive film 30 is deposited so as to form the gate of the transistor. This film is generally polycrystalline silicon doped with phosphorus (5 to 10% in volume) and has a thickness of between 100 and 300 nm and typically 200 nm.

Then a resin etching mask 32 is formed according to conventional photolithographic methods and comprising a pattern 34 fixing the dimensions of the gate of the transistor to be embodied.

As this gate is unable to be self-aligned with respect to the source and the drain, the width of the pattern 34 of the mask 32 (measured inside the plane of the figures) is advantageously larger than the opening 13 of the resin mask 12 fixing the location of the "LOCOS" (see FIG. 5).

This is followed by an anisotropic etching of the film 30, for example of the reactive ionic type, by using $SF_6$ for etching the silicon. The film 28 may possibly be then etched by a reactive ionic etching of $CHF_3$ (this etching may be total or partial). On FIG. 6, the film 28 is shown fully etched.

Figure 6:
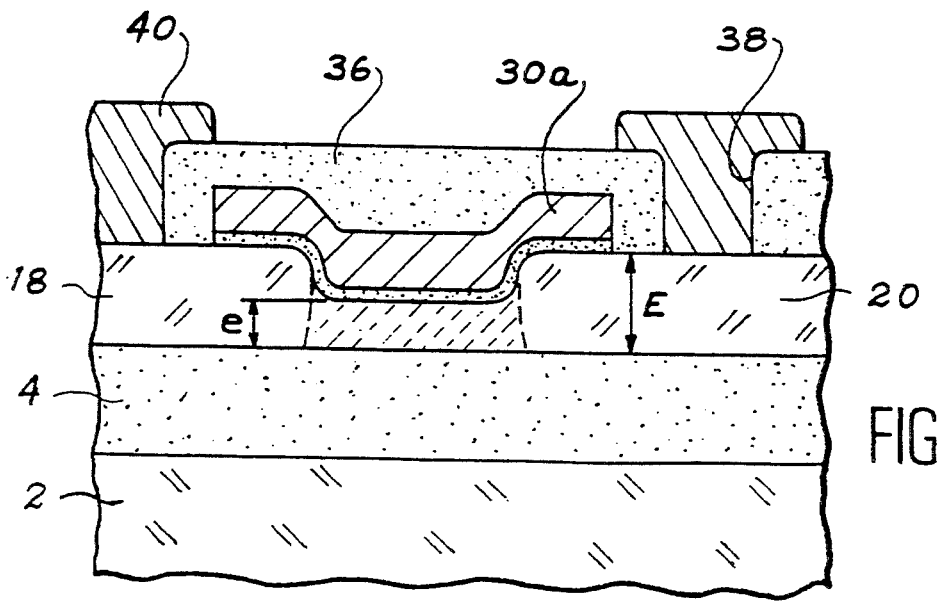

The structure obtained after elimination of the masking resin is shown on FIG. 6. This figure shows that the gate 30a of the transistor overlaps the source 18 and the drain 20 regions.

Then a nonconductor 36 is deposited by conventional means and made of borosilicate glass with a thickess greater than the stacking of the gate and gate nonconductor and contact holes 38 are formed in this glass for the source, drain and the gate.

The method is completed by a generally aluminium contact engagement metallization 40 of the source, drain and gate to be etched according to the desired pattern.

Implantation annealings are carried out by successive oxidations and/or specific activation annealings at high temperatures.

In the specific example described above, at the end of the method the thickness e of silicon in the channel 26 of the transistor is of about 45 nm, whereas the thickness E of silicon in the source and drain regions is about 165 nm.

More generally, the method is able to obtain a thinned zone of between 1 and 150 nm according to the thicknesses of the original silicon film, the thickness of the "LOCOS" and of the thermic oxides.

Thus, a thinning of the silicon in the region of the channel has been embodied.

Moreover, the method of the invention is simple to implement and does not comprise any critical stage.

In addition, the thickness obtained in the source and drain zones is sufficient to allow for the formation (if needed) of a siliciding on these zones so as to reduce their electric resistance.

The previous description has merely been given by way of illustration and modifications could be effected by experts in this field. In particular, it is possible to replace all the thermic oxidations by thermic nitriding processes, to deposit the silicon nitride 10 directly on the silicon without any base 8, and carry out the threshold implantation 24 through the gate oxide 28 without using any sacrificial oxidation. In addition, the thicknesses of the films may be modified.

What is claimed is:

1. Method for producing an MIS transistor comprising a channel, a source and a drain on both sides of the channel and a gate on the channel and separated from the source and the drain, said method comprising the following stages:
   a) forming a thin film of silicon on a nonconductor,
   b) forming on the thin silicon film a mask including an opening at the location provided for the channel of the transistor,
   c) forming a local thick oxidation film by oxidizing the unmasked silicon so as to locally thin the silicon and to form a thinned silicon zone in said silicon film,
   d) removing the mask,
   e) effecting ion drain and source implantation in the silicon, the oxidation film being used as a self-aligning mask to mask this implantation,
   f) removing the oxidation film,
   g) forming a thin gate nonconductor overlapping the source and the drain, and
   h) forming the gate on the gate nonconductor.

2. Method according to claim 1, wherein the thin silicon film is formed via an ionic implantation of oxygen in a monocrystalline silicon substrate, followed by annealing of the implanted substrate.

3. Method according to claim 1, further comprising the following stages that are carried out after the removal of the oxidation film and before forming the gate nonconductor:
   oxidizing the silicon film to form a sacrificial oxidation film;
   implanting ions of a type with a conductivity opposite or identical to the source and drain through the sacrificial oxidation film; and
   eliminating the sacrificial oxidation film after implantation.

4. Method according to claim 1, wherein the thinned silicon under the gate has a thickness of between 1 to 150 nm.

5. Method according to claim 1, wherein the gate is made of a doped polycrystalline silicon.

6. Method according to claim 3, wherein the thinned silicon under the gate has a thickness of between 1 to 150 nm.

7. Method according to claim 6, wherein the gate is made of a doped polycrystalline silicon.

* * * * *